(12) United States Patent
Choi et al.

(10) Patent No.: US 6,795,369 B2
(45) Date of Patent: Sep. 21, 2004

(54) ADDRESS BUFFER AND SEMICONDUCTOR MEMORY DEVICE USING THE SAME

(75) Inventors: Jong Hyun Choi, Gyeonggi-do (KR); Jae-Young Lee, Seoul (KR); Hyong-Ryol Hwang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/303,409

(22) Filed: Nov. 22, 2002

(65) Prior Publication Data

US 2004/0100853 A1 May 27, 2004

(51) Int. Cl.[7] .................................................. G11C 8/00
(52) U.S. Cl. ............................ 365/230.08; 365/189.05; 365/193
(58) Field of Search ....................... 365/230.08, 230.06, 365/189.05, 185.05, 193, 198, 63

(56) References Cited

U.S. PATENT DOCUMENTS

| | | | | |
|---|---|---|---|---|
| 5,262,998 A | * | 11/1993 | Mnich et al. ............... 365/222 |
| 5,471,429 A | * | 11/1995 | Lee et al. .................... 365/201 |
| 6,392,938 B1 | * | 5/2002 | Choi et al. .................. 365/200 |
| 2001/0030889 A1 | * | 10/2001 | Seki et al. ............. 365/185.05 |

* cited by examiner

Primary Examiner—Gene N. Auduong
(74) Attorney, Agent, or Firm—Marger Johnson & McCollom, P.C.

(57) ABSTRACT

The present invention discloses an address buffer and a semiconductor memory device having the address buffer. The address buffer comprises a first buffer for latching a signal in response to a first control signal in a normal operation mode in the semiconductor memory device and generating a buffered signal by buffering the latched signal in response to a second control signal, and a second buffer for maintaining a mode-setting signal in a reset status in the normal operation mode and for outputting the mode-setting signal by using the latched signal in response to the first control signal and a mode-setting command in a mode-setting operation mode. Accordingly, the mode-setting signal is generated only in the mode-setting operation mode, thereby reducing undesirable current consumption.

14 Claims, 7 Drawing Sheets

ADDRESS BUFFER AND SEMICONDUCTOR MEMORY DEVICE USING THE SAME

BACKGROUND OF THE INVENTION

1. Field of the Invention

The present invention relates to an address buffer and a semiconductor memory device having the same.

2. Description of Related Art

A conventional semiconductor memory device includes an address buffer comprising a normal address buffer unit for buffering addresses received from address pins in normal operation mode and a mode-setting signal buffer unit for buffering mode-setting signals received from the address pins in a mode-setting operational mode.

The conventional address buffer, however, involves a problem that the logic level of the mode-setting signals is transited in response to the logic level transition of the addresses input through the address pins in the normal operational mode, which increases current consumption. That is, the mode-setting signal buffer unit is actually operated during the normal operational mode, thereby undesirably consuming current.

FIG. 1 illustrates a conventional semiconductor memory device. The conventional semiconductor memory device comprises address pins 10-1 to 10-n, command pins 12-1 to 12-3, address buffers 14-1 to 14-n, a chip selection signal (CSB) buffer 16-1, a row address strobe signal (RASB) buffer 16-2, a column address strobe signal (CASB) buffer 16-3, an address decoder 18, a mode-setting register 20, a command decoder 22 and a PCLKR signal generating circuit 24.

The address pins 10-1 to 10-n receive external addresses A1 to An. The command pins 12-1, 12-2 and 12-3 receive command signals CSB, RASB, CASB, respectively. The address buffers 14-1 to 14-n latch the external addresses A1 to An in response to the PCLKR signal and generate buffered mode-setting signals MAB1 to MABn. The address buffers 14-1 to 14-n buffer the external addresses A1 to An in response to the active command ACT and generate buffered addresses AB1 to ABn. The address decoder 18 decodes the buffered addresses AB1 to ABn and generates decoded addresses DAB1 to DABm. The mode-setting register 20 receives the buffered mode-setting signals MAB1 to MABn and outputs mode-setting signals MDAB1-MDABk in response to the mode-setting command MRS.

The CSB buffer 16-1 buffers the chip selection signal CSB and generates a buffered chip selection signal CSBB. The RASB buffer 16-2 buffers the row address strobe signal RASB and generates a buffered row address strobe signal RASBB. The CASB buffer 16-3 buffers a column address strobe signal CASB and generates a buffered column address strobe signal CASBB. The command decoder 22 decodes the buffered command signals CSBB, RASBB, CASBB and generates a mode-setting command MRS, an active command ACT, a pre-charge command PRE and a refresh command REF. The PCLKR signal generating circuit 24 generates the PCLKR signal in response to the buffered row address strobe signal RASBB.

FIG. 2 illustrates a circuit diagram of the address buffer comprising the normal address buffer unit 30 and the mode-setting signal buffer unit 32. The normal address buffer unit 30 comprises inverters I1, I2, I5, I6 and I7, complementary metal oxide semiconductor (CMOS) transmission gates C1 and C2, and a latch L1 comprising inverters I3 and I4. The mode-setting signal buffer unit 32 comprises an inverter I8, a CMOS transmission gate C3, a PMOS transistor P and a latch L2 comprising inverters I9 and I10.

In FIG. 2, references A, AB, MAB, ACT denote an external address externally input, a buffered address, a mode-setting signal and an active command, respectively. The PCLKR signal is a clock signal generated in response to the row address strobe signal RASB of logic "low" level. A reference VCCH denotes a voltage that maintains a logic "high" level upon power-up and is then transited to a logic "low" level.

The inverter I1 inverts the external address A. The CMOS transmission gate C1 is turned on in response to the PCLKR signal of logic "low" level, thereby transmitting an output signal of the inverter I1 to the latch L1. The latch L1 latches and inverts an output signal of the CMOS transmission gate C1. The CMOS transmission gate C2 is turned on in response to the active command of a logic "high" level, thereby transmitting an output signal of the latch L1. The inverters I6 and I7 buffer an output signal of the CMOS transmission gate C2, thereby generating the buffered address AB.

The inverter I8 inverts the output signal of the latch L1. The CMOS transmission gate C3 is turned on in response to the signal PCLKR of logic "high" level, thereby transmitting an output signal of the inverter I8. The PMOS transistor P is turned on in response to the VCCH signal of logic "low" level after power-up and when the voltage of a node n equals the power supply voltage. The latch L2 is reset by the PMOS transistor P, thereby generating the mode-setting signal MAB of a logic "low" level. Further, the latch L2 generates the mode-setting signal of a logic "low" level when a signal of a logic "high" level is transmitted from the CMOS transmission gate C3 to the latch L2. Conversely, latch L2 generates the mode-setting signal of logic "high" level when a signal of logic "low" level is transmitted.

Therefore, in the normal operation mode that the active command ACT, the pre-charge command PRE or the refresh command REF is applied to the semiconductor memory device, the CMOS transmission gate C1 is turned on in response to the PCLKR signal of a logic "low" level generated in response to row address strobe signal RASB, so that the external address A is transmitted to the latch L1 via the inverter I1. When the signal PCLKR of the logic "low" level is transited to the logic "high" level, the CMOS transmission gate C3 is turned on and a signal, i.e., the address A, latched in the latch L1, is transmitted via the inverter I8 and the CMOS transmission gate C3 to the latch L2.

Accordingly, the mode-setting signal MAB is transited from a logic "low" level to a logic "high" level along with the logic level transition of the address A during the normal operation mode, thereby causing undesired current consumption.

FIG. 3 is a timing diagram illustrating operation of the address buffer in FIG. 2, wherein the address A is transited from a logic "low" level to a logic "high" level.

When the row address strobe signal RASB of a logic "low" level and the address A transiting from a logic "low" level to a logic "high" level are externally input to the semiconductor memory device at rising edge of a clock signal CLK, the PCLKR signal is generated in response to the row address strobe signal RASB. The CMOS transmission gate C1 transmits the address A to the latch L1 in response to the PCLKR signal of a logic "low" level. The CMOS transmission gate C3 transmits the signal output from the latch L1 to the latch L2 in response to the PCLKR signal of a logic "high" level. Accordingly, current is consumed by the address buffer because the mode-setting signal MAB is transited from a logic "low" level to a logic "high" level along with level transition of the address A in the normal operation mode. Further, if the active command ACT of a logic "high" level is generated, the CMOS transmission gate C2 is turned on and generates the buffered address AB rising up from a logic "low" level to a logic "high" level.

Worse, such current consumption by the mode-setting signal buffer unit increases as the number of the address buffers increases.

SUMMARY OF THE INVENTION

To overcome the problems described above, a preferred embodiment of the present invention provides an address buffer wherein a mode-setting signal is not changed in response to logic level of an address externally input during a normal operation mode, thereby reducing current consumption, and a semiconductor memory device utilizing such an address buffer.

In accordance with one aspect of the present invention, there is provided an address buffer comprising: a first buffering means for generating a buffered address upon buffering a signal externally applied in a normal operation mode; and a second buffering means for keeping a mode-setting signal in a reset status in the normal operation mode and for generating the mode-setting signal by buffering the signal externally applied in a mode-setting operation mode.

The first address buffer includes: a first transmission gate for transmitting the signal by being turned on in response to a first control signal; a first latch for latching an output signal of the first transmission gate; a second transmission gate for transmitting an output signal of the first latch by being turned on in response to a second control signal; and a buffer for generating the buffered address by buffering an output signal of the second transmission gate.

The second buffer includes: an ANDing circuit for ANDing the first control signal and the mode-setting command; a third transmission gate for transmitting the output signal of the first latch in response to an output signal of the ANDing circuit; and a second latch for generating the mode-setting signal by latching an output signal of the third transmission gate and resetting the mode-setting signal.

The second latch further includes a reset transistor for resetting the mode-setting signal.

In accordance with another aspect of the present invention, there is provided a semiconductor memory device comprising: a plurality of pins; and a plurality of buffers for buffering signals input through the plurality of pins, wherein each of the buffers includes: a first buffering means for generating a buffered signal by buffering the signals in a normal operation mode; and a second buffering means for maintaining a mode-setting signal in a reset status in the normal operation mode and generating the mode-setting signal by buffering the signals in a mode-setting operation mode.

In accordance with further another aspect of the present invention, there is provided a semiconductor memory device comprising: a plurality of pins; and a plurality of buffers for buffering signals input through the plurality of pins, wherein each of the buffer includes: a first buffering means for latching the signals in response to a first control signal in a normal operation mode of the semiconductor memory device and generating buffered signals by buffering latched signals in response to a second control signal; a second buffering means for generating a mode-setting signal using the latched signals in response to the first control signal and a mode-setting command in a mode-setting operation mode, and maintaining the mode-setting signal in reset status in the normal operation mode.

BRIEF DESCRIPTION OF THE DRAWINGS

The other features and advantages of the present invention will be readily apparent to those of ordinary skill in the art upon review of the detailed description that follows when taken in conjunction with the accompanying drawings, in which like reference numerals denote like parts, and in which.

DETAILED DESCRIPTION OF THE INVENTION

Reference will now be made in detail to a preferred embodiment of the present invention, example of which is illustrated in the accompanying drawings.

Figure 1:
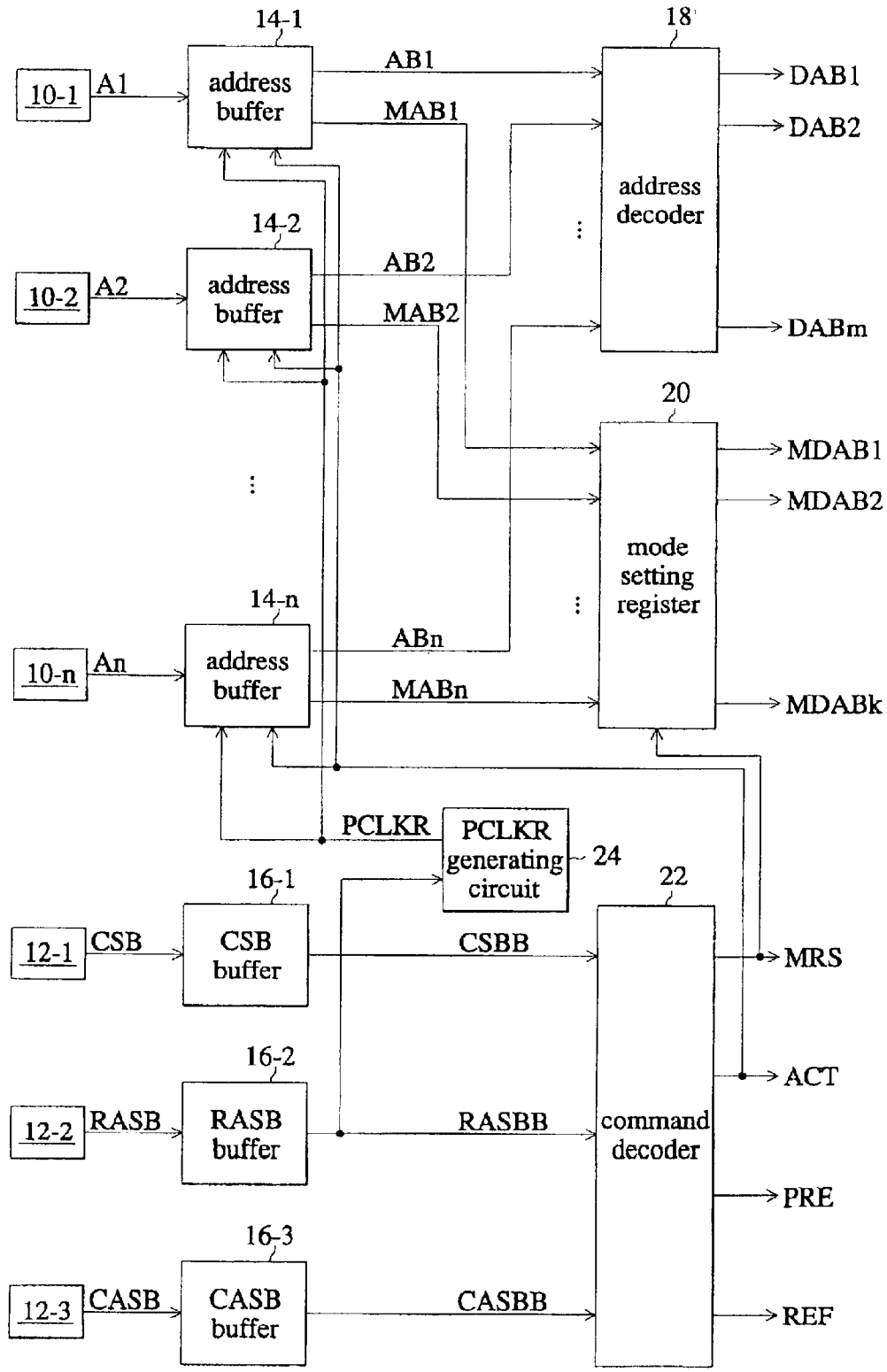
FIG. 1 is a circuit diagram of a semiconductor memory device in accordance with the conventional art.
Figure 4:
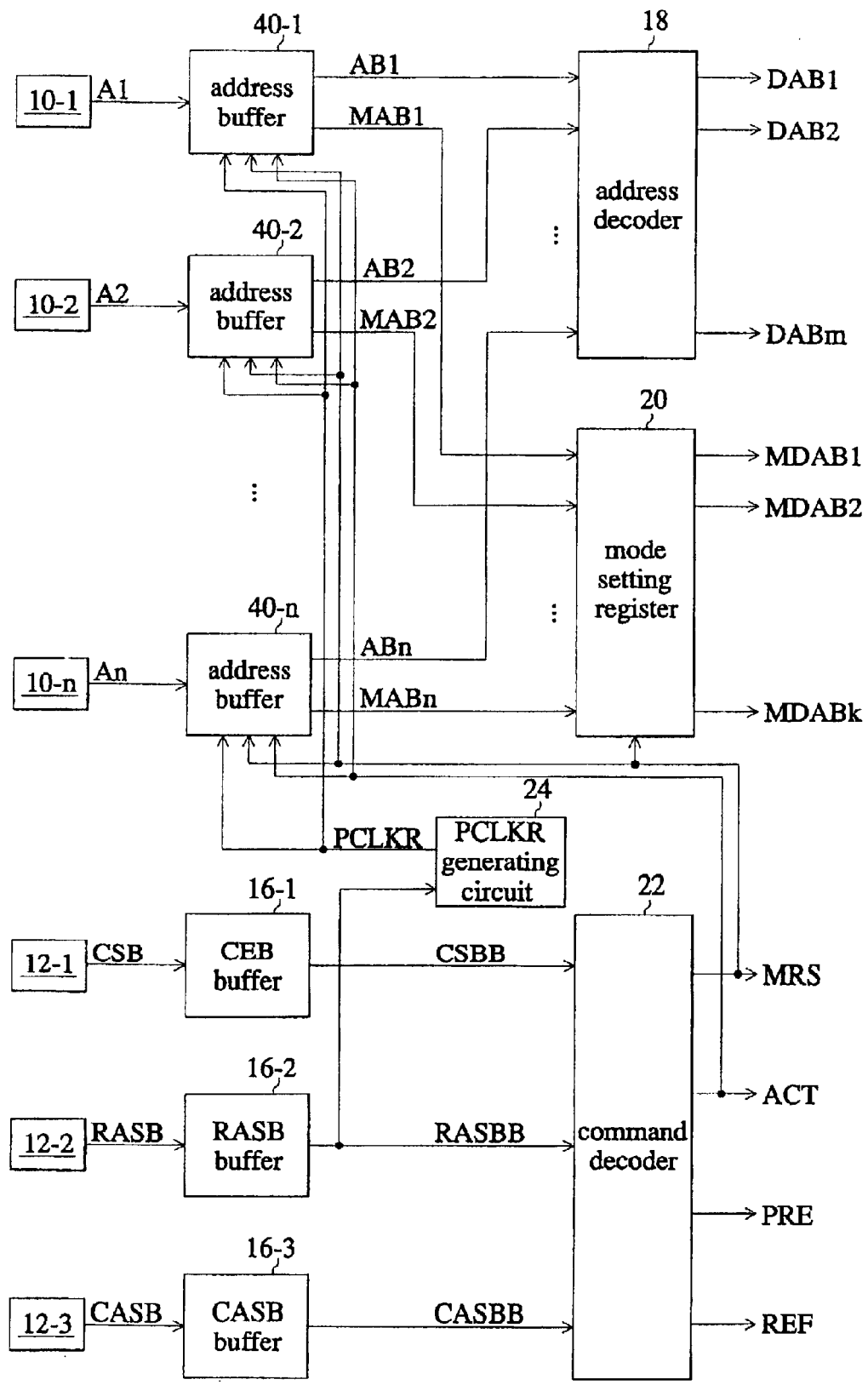
FIG. 4 is a block diagram of a semiconductor memory device in accordance with the present invention.

FIG. 4 is a block diagram of a semiconductor memory device in accordance with one embodiment of the present invention. Like reference designates the like element in FIG. 1 and FIG. 4. Address buffers 40-1 to 40-n in the semiconductor memory device of FIG. 4 are different from the address buffers 14-1 to 14-n in FIG. 1 and other elements in FIG. 4 are the same as FIG. 1.

The address buffers 40-1 to 40-n latch external addresses A1 to An in response to a PCLKR signal, and then generate mode-setting signals MAB1 to MABn in response to a buffered clock signal PCLK and to a mode-setting command MRS and buffered addresses AB1 to ABn by buffering the latched external addresses A1 to An in response to an active command ACT.

That is, the address buffers 40-1 to 40-4 in FIG. 4 generate the buffered addresses AB1 to ABn and the mode-setting signals MAB1 to MABn maintain a logic "low" level in normal operation mode of the semiconductor memory device. The mode-setting signals MAB1 to MABn are generated only when the mode-setting command MRS is generated.

Accordingly, the address buffers in accordance with the present invention do not consume current in the normal operation mode even if the addresses are changed because the logic level of the mode-setting command MRS is not changed during the normal operation mode.

Figure 5:
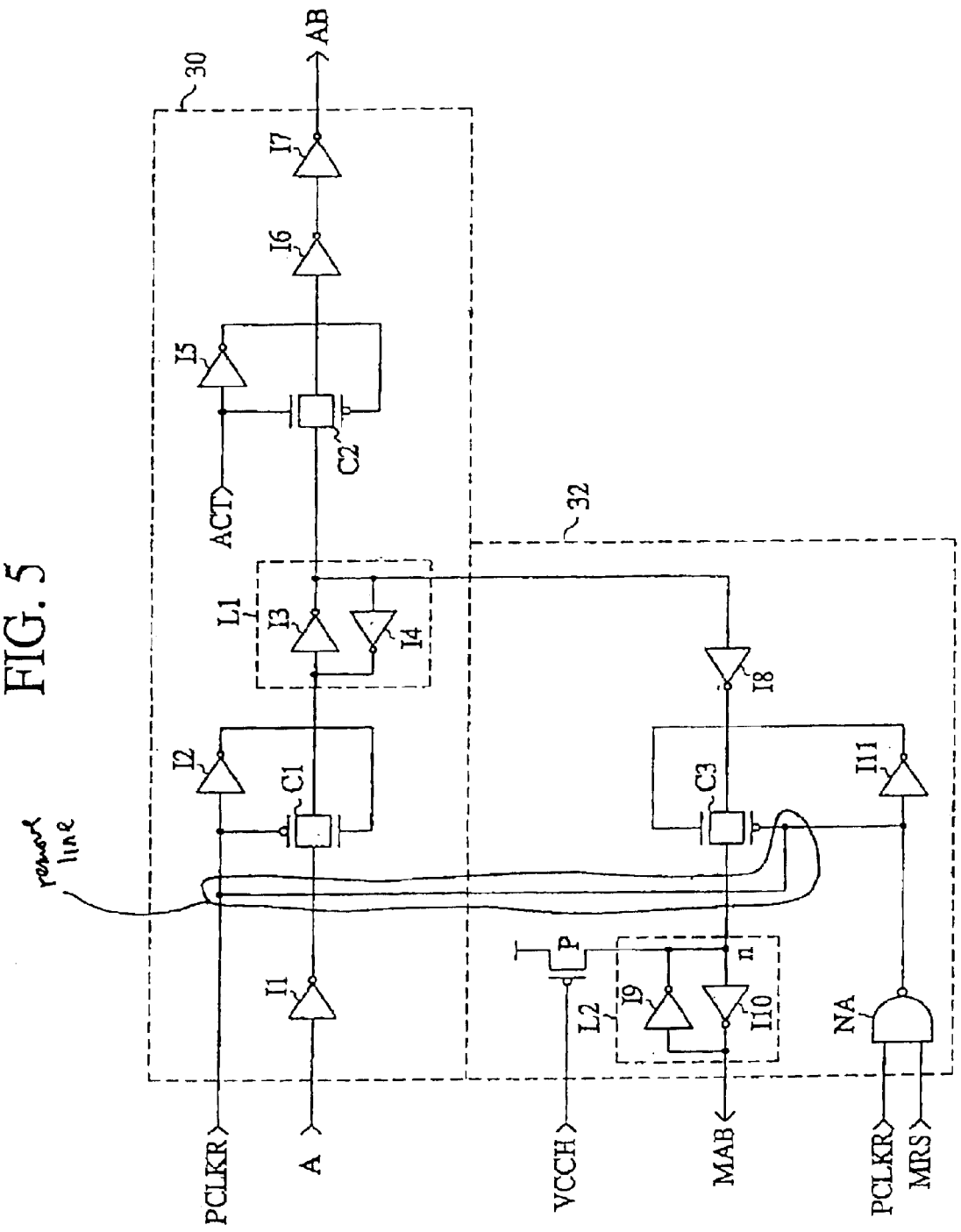
FIG. 5 is a circuit diagram of an address buffer in accordance with the present invention.

FIG. 5 is a circuit diagram of the address buffer in accordance with the present invention. The address buffer in accordance with the present invention is configured to add a NAND gate NA and an inverter I11 to the mode-setting signal buffer unit 32' of the address buffer in FIG. 2.

Figure 2:
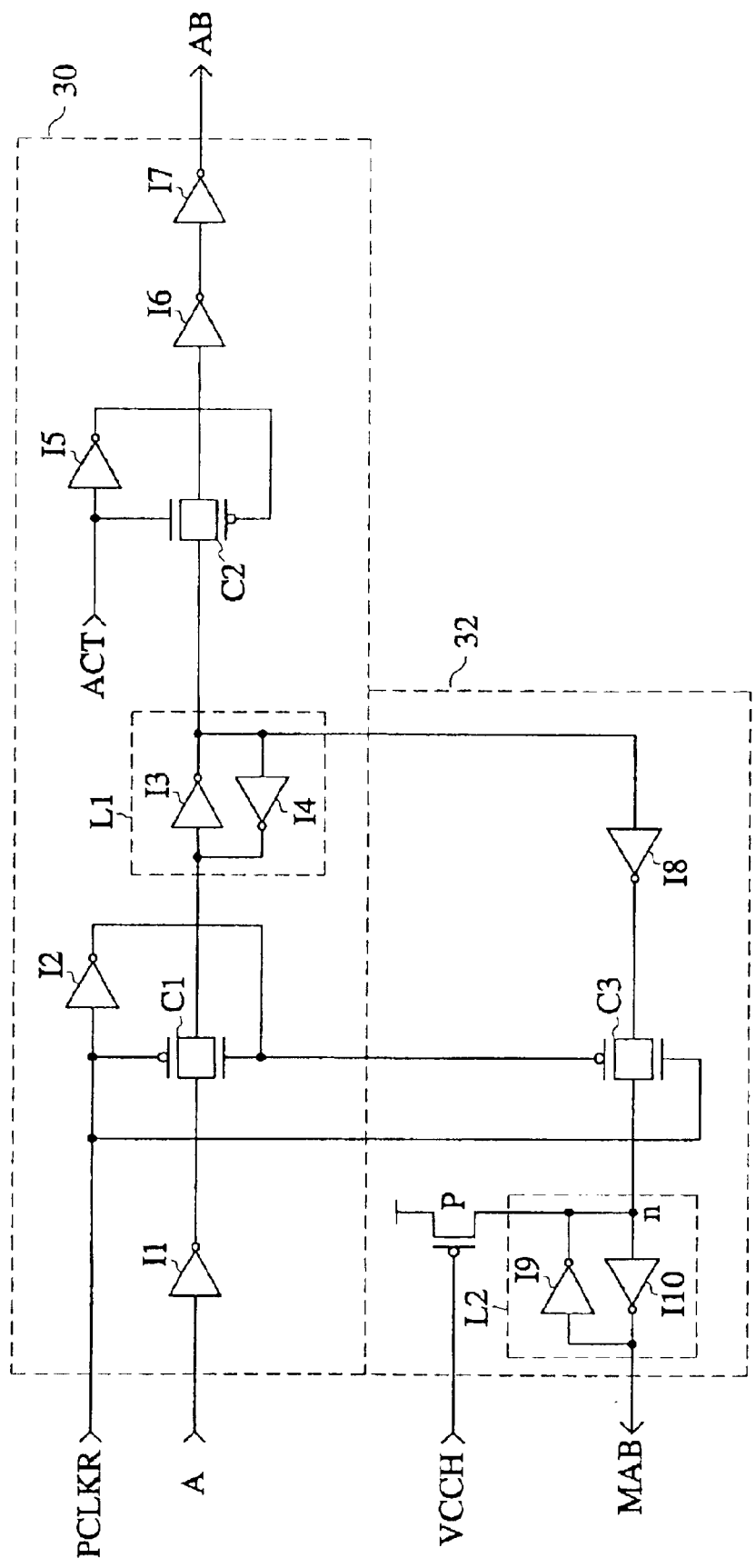
FIG. 2 is a circuit diagram of an address buffer in accordance with the conventional art.
Figure 3:
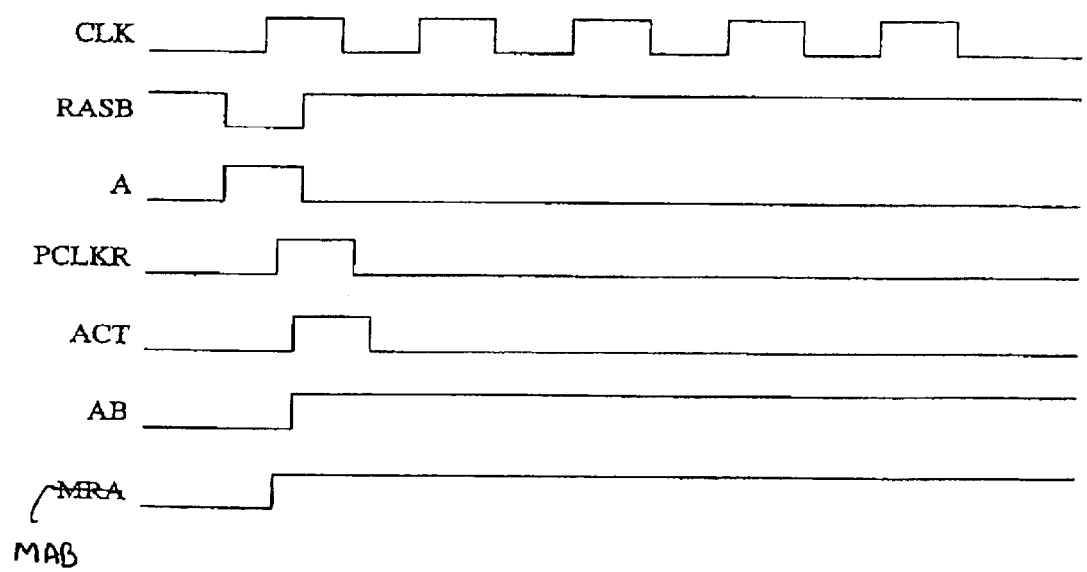
FIG. 3 is a timing diagram illustrating the operation of the address buffer shown in FIG. 2.

Comparing the address buffers in FIG. 2 with that in FIG. 5, the address buffer unit 30 in FIG. 5 is identical to that in FIG. 2 but the mode-setting signal buffer unit 32' in FIG. 5 is different from the mode-setting signal buffer unit 32 in FIG. 2.

The NAND gate NA NANDs the PCLKR signal and the mode-setting command MRS. The inverter I11 inverts an output signal of the NAND gate NA.

Operation of the address buffers shown in FIG. 5 will be described below. Operation of the address buffer unit 30 in FIG. 5 is identical to the operation of the address buffer unit 30 in FIG. 2. Accordingly, explanation about the operation of the address buffer unit 30 will be omitted. Operation of the mode-setting signal buffer unit 32' will be described.

In the normal operation mode of the semiconductor memory device, the NAND gate NA generates a signal of a logic "high" level when the PCLKR signal of a logic "high" level and the mode-setting command MRS of a logic "low" level are applied to the semiconductor memory device and then the CMOS transmission gate C3 is turned off in response to the signal of a logic "high" level output from the NAND gate NA. Accordingly, the latched signal latched by the latch L1 is not transmitted to the latch L2. Thus, the mode-setting signal MAB maintains logic "low" level regardless of a change of the address A and the mode-setting signal buffer unit 32' does not consume current in the normal operation mode.

On the other hand, during the mode-setting operation, the NAND gate NA generates a signal of a logic "low" level, turning on the CMOS transmission gate C3 when the PCLKR signal of logic "high" level and the mode-setting command MRS of a logic "high" level are applied to the semiconductor memory device. Those of skill in the art will appreciate that NAND gate NA and inverter I11 thus effectively AND the PCLKR signal and the mode-setting command MRS. The CMOS transmission gate C3 transmits the signal latched by the latch L1 to the latch L2 and the latch L2 latches the signal transmitted from the CMOS transmission gate C3. At this time, the mode-setting signal MAB is changed in response to the change of the address A.

Figure 6A:
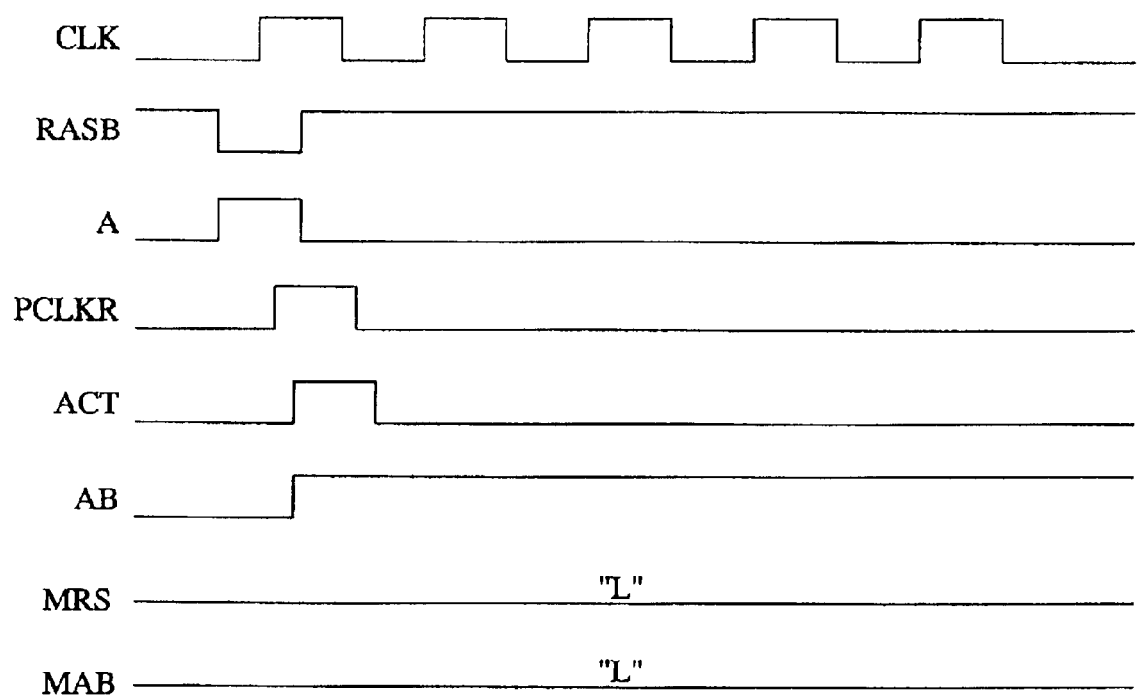
FIGS. 6A and 6B are timing diagrams illustrating operation of the address buffer shown in FIG. 5.
Figure 6B:
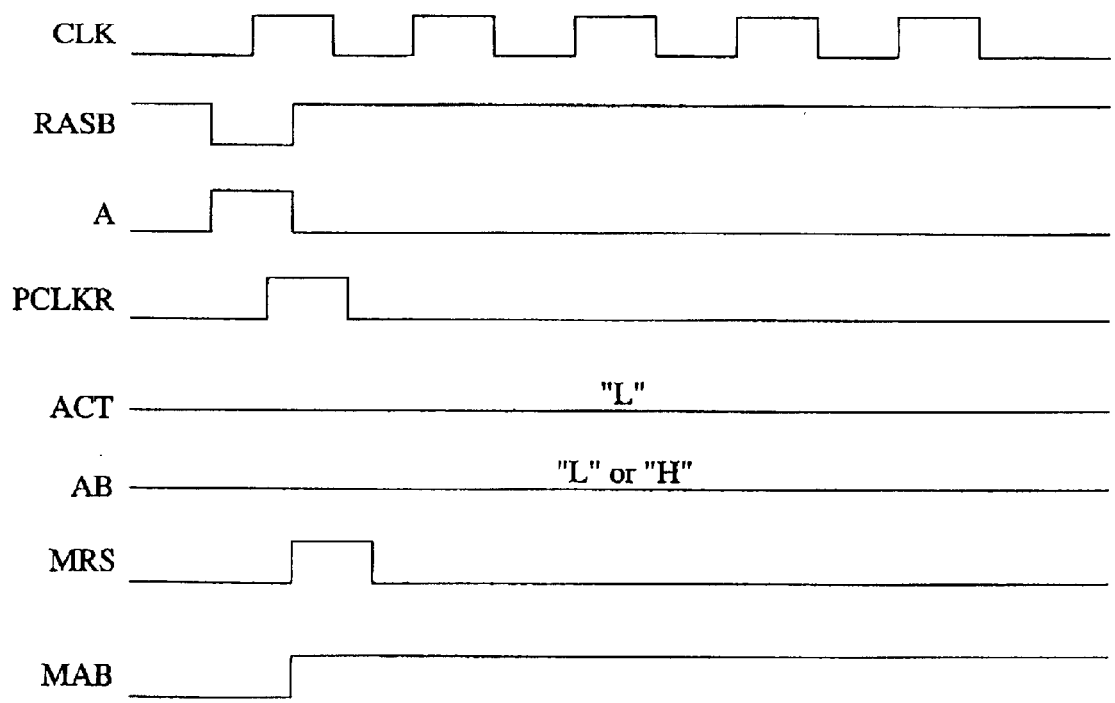

FIGS. 6A and 6B are timing diagrams showing operation of the address buffer shown in FIG. 5.

Operation of the address buffer in normal operation mode will be described in conjunction with FIG. 6A. At a rising edge of the clock signal CLK, when the row address strobe signal RASB of a logic "low" level is externally applied to the semiconductor memory device along with the row address A, the PCLKR signal of a logic "high" level is generated. Therefore, the CMOS transmission gate C1 transmits the address A by being turned on and the latch L1 latches the address A in response to the PCLKR signal of a logic "low" level. The CMOS transmission gate C3 is turned off in response to the PCLKR signal of logic "low" level, thereby not transmitting the address A. Accordingly, the mode-setting signal MAB maintains a logic "low" level.

Further, in case the PCLKR signal is transited to a logic "high" level and the mode-setting command MRS maintains a logic "low" level, the CMOS transmission gate C3 is turned off, not transmitting the signal. Accordingly, even if the PCLKR signal is transited to a logic "high" level, the mode-setting signal MAB maintains logic "low" level, not being changed. Further, when the active command ACT of a logic "high" level is generated, the CMOS transmission gate C2 is turned on, thereby transmitting the signal latched by the latch L1. That is, a buffered address AB of a logic "high" level is generated.

As shown in FIG. 6A, the CMOS transmission gate forming the mode-setting signal buffer is turned off, thereby keeping the mode-setting signal MAB in a logic "low" level and preventing undesired current consumption in the address buffer.

Operation of the address buffer in the mode-setting operation mode will be described in conjunction with FIG. 6B. At a rising edge of the clock signal CLK, when the row address strobe signal RASB of a logic "low" level is externally applied to the semiconductor memory device along with the row address A, the PCLKR signal of a logic "high" level is generated. The CMOS transmission gate C1 transmits the address A by being turned on in response to the PCLKR signal of a logic "low" level and the latch L1 latches the address A.

When the mode-setting command MRS is in logic "high" level, the CMOS transmission gate C3 is turned on and transmits the signal latched by the latch L1 to the latch L2. Therefore, the mode-setting signal MAB may be transited from a logic "low" level to a logic "high" level. At this time, the CMOS transmission gate C2 is turned off because the active command is not generated, and the signal latched in the latch L1 is not transmitted. As a result the buffered address AB that is an output signal of the address buffer unit 30 maintains its previous logic level. That is, the logic level of the mode-setting signal MAB is transited in response to the externally applied signal during the mode-setting operation.

Accordingly, in the address buffer in accordance with the present invention, the mode-setting signal maintains a logic "low" level in the normal operation mode and its logic level is changed in response to the externally applied signal only in the mode-setting operation mode, thereby reducing undesired current consumption in the normal operation mode.

In the description with respect to the embodiment of the present invention, the mode-setting signal is input from the address pins in the mode-setting operation mode, but the mode-setting signal may be input through another pin. Thus, the present invention may be applied to the address buffer receiving the mode-setting signal from pins other than the address pins also.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. An address buffer comprising:
    a first buffering means for generating a buffered address upon buffering a signal externally applied in a normal operation mode; and
    a second buffering means for generating the mode-setting signal by buffering the signal externally applied in a mode-setting operation mode and not in the normal operation mode.

2. The address buffer according to claim 1, wherein the first buffering means includes:
    a first transmission gate for transmitting the externally applied signal by being turned on in response to a first control signal;
    a first latch for latching an output signal of the first transmission gate;

a second transmission gate for transmitting an output signal of the first latch by being turned on in response to a second control signal; and a buffer for generating the buffered address by buffering an output signal of the second transmission gate.

3. The address buffer according to claim 2, wherein the second buffering means includes:

an ANDing circuit for ANDing the first control signal and a mode-setting command;

a third transmission gate for transmitting the output signal of the first latch in response to an output signal of the ANDing circuit; and a second latch for generating the mode-setting signal by latching an output signal of the third transmission gate.

4. The address buffer according to claim 3, wherein the second latch further includes a reset transistor for resetting the mode-setting signal.

5. A semiconductor memory device comprising:

a plurality of pins; and a plurality of buffers for buffering signals input through the plurality of pins, wherein each of the buffers includes:

a first buffering means for generating a buffered signal by buffering a corresponding one of the input signals in a normal operation mode; and a second buffering means for generating the mode-setting signal by buffering the corresponding one of the input signals in a mode-setting operation mode and not in the normal operation mode.

6. The semiconductor memory device according to claim 5, wherein the first buffering means includes:

a first transmission gate for transmitting the corresponding one of the input signals by being turned on in response to a first control signal;

a first latch for latching an output signal of the first transmission gate;

a second transmission gate for transmitting an output signal of the first latch by being turned on in response to a second control signal; and a buffer for generating the buffered signal by buffering an output signal of the second transmission gate.

7. The semiconductor memory device according to claim 5, wherein the second buffering means includes:

an ANDing circuit for ANDing the first control signal and a mode-setting command;

a third transmission gate for transmitting the output signal of the first latch in response to an output signal of the ANDing circuit; and a second latch for generating the mode-setting signal by latching an output signal of the third transmission gate.

8. The semiconductor memory device according to claim 7, wherein the second latch further comprises a reset transistor for resetting the mode-setting signal.

9. A semiconductor memory device, comprising:

a plurality of pins; and a plurality of buffers for buffering signals input through the plurality of pins, wherein each of the buffers includes:

a first buffering means for latching a corresponding one of the input signals in response to a first control signal in a normal operation mode of the semiconductor memory device and for generating a corresponding one of the buffered signals by buffering the latched signal in response to a second control signal;

a second buffering means for generating a mode-setting signal using the latched signal in response to the first control signal and a mode-setting command in a mode-setting operation mode and not in the normal operation mode.

10. The semiconductor memory device according to claim 9, wherein the semiconductor memory device further comprises a first control signal generating circuit for generating the first control signal in response to a row address strobe signal.

11. The semiconductor memory device according to claim 10, wherein the semiconductor memory device further comprises a command decoder for generating the second control signal and the mode-setting command by decoding a chip selection signal, a column address strobe signal and the row address strobe signal.

12. The semiconductor memory device according to claim 9, wherein the first buffering means comprises:

a first transmission gate for transmitting the corresponding one of the input signals by being turned on in response to the first control signal;

a first latch for latching an output signal of the first transmission gate as the latched signal;

a second transmission gate for transmitting the latched signal in response to the second control signal; and a buffer for generating the corresponding one of the buffered signals by buffering an output signal of the second transmission gate.

13. The semiconductor memory device according to claim 9, wherein the second buffering means comprises:

an ANDing circuit for ANDing the first control signal and the mode-setting command;

a third transmission gate for transmitting the output signal of the first latch in response to an output signal of the ANDing circuit; and a second latch for generating the mode-setting signal by latching an output signal of the third transmission gate.

14. The semiconductor memory device according to claim 13, wherein the second latch further comprises a reset transistor for resetting the mode-setting signal.

* * * * *

UNITED STATES PATENT AND TRADEMARK OFFICE
CERTIFICATE OF CORRECTION

PATENT NO. : 6,795,369 B2
DATED : September 21, 2004
INVENTOR(S) : Choi et al.

It is certified that error appears in the above-identified patent and that said Letters Patent is hereby corrected as shown below:

Drawings,
FIG. 5, "32" should read -- 32' --.
FIG. 5, "*remove line*" and encircled line should be deleted.

Signed and Sealed this

Second Day of August, 2005

JON W. DUDAS
*Director of the United States Patent and Trademark Office*